US011900999B2

(12) United States Patent
Giduturi

(10) Patent No.: US 11,900,999 B2
(45) Date of Patent: *Feb. 13, 2024

(54) MEMORY CYCLING TRACKING FOR THRESHOLD VOLTAGE VARIATION SYSTEMS AND METHODS

(71) Applicant: Micron Technology, Inc., Boise, ID (US)

(72) Inventor: Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 100 days.

This patent is subject to a terminal disclaimer.

(21) Appl. No.: 17/702,562

(22) Filed: Mar. 23, 2022

(65) Prior Publication Data

US 2022/0215877 A1    Jul. 7, 2022

Related U.S. Application Data

(63) Continuation of application No. 17/091,860, filed on Nov. 6, 2020, now Pat. No. 11,309,023.

(51) Int. Cl.
| | | |
|---|---|---|
| *G11C 11/00* | (2006.01) | |
| *G11C 13/00* | (2006.01) | |
| *G06F 9/30* | (2018.01) | |

(52) U.S. Cl.
CPC ........ *G11C 13/003* (2013.01); *G06F 9/30116* (2013.01); *G11C 13/004* (2013.01); *G11C 13/0004* (2013.01); *G11C 13/0035* (2013.01); *G11C 13/0038* (2013.01); *G11C 13/0069* (2013.01)

(58) Field of Classification Search
CPC .............. G11C 13/003; G11C 13/0004; G11C 13/0035; G11C 13/0038; G11C 13/004; G11C 13/0069; G11C 2013/005; G11C 2013/0078; G11C 2213/71; G11C 2213/72; G11C 2213/76; G11C 13/0011; G11C 8/08; G11C 7/12; G06F 9/30116
USPC ........................................................ 365/148
See application file for complete search history.

(56) References Cited

U.S. PATENT DOCUMENTS

| | | | |
|---|---|---|---|
| 5,537,562 | A | 7/1996 | Gallup et al. |
| 6,735,653 | B2 | 5/2004 | O Mathuna et al. |
| 7,929,356 | B2 | 4/2011 | De Cara et al. |

(Continued)

FOREIGN PATENT DOCUMENTS

| | | |
|---|---|---|
| CN | 102884585 A | 1/2013 |
| CN | 109584920 A | 4/2019 |

OTHER PUBLICATIONS

Chinese Office Action for Chinese Application No. 202111213354.0, dated Jul. 26, 2022, 16 pgs.

*Primary Examiner* — Tha-O H Bui
(74) *Attorney, Agent, or Firm* — Fletcher Yoder, P.C.

(57) ABSTRACT

A memory system may include multiple memory cells to store logical data and cycle tracking circuitry to track a number of cycles associated the memory cells. The cycles may be representative of one or more past accesses of the memory cells. The memory system may also include control circuitry to access the memory cells. Accessing of the memory cell may include a read operation, a write operation, or both. During the accessing of the memory cell, the control circuitry may determine a voltage parameter of the access based at least in part on the tracked number of cycles.

20 Claims, 7 Drawing Sheets

(56) References Cited

U.S. PATENT DOCUMENTS

| | | |
|---|---|---|
| 10,509,720 B2 | 12/2019 | Kim |
| 2008/0089161 A1* | 4/2008 | Wong ............... G11C 29/50004 |
| | | 365/226 |
| 2010/0322000 A1 | 12/2010 | Shim et al. |
| 2012/0195106 A1* | 8/2012 | Wang ..................... G11C 7/227 |
| | | 365/207 |
| 2017/0269586 A1 | 9/2017 | Ouyang |

* cited by examiner

MEMORY CYCLING TRACKING FOR THRESHOLD VOLTAGE VARIATION SYSTEMS AND METHODS

CROSS REFERENCE TO RELATED APPLICATIONS

This application is a Continuation of and claims priority to U.S. patent application Ser. No. 17/091,860, filed Nov. 6, 2020, and entitled "MEMORY CYCLING TRACKING FOR THRESHOLD VOLTAGE VARIATION SYSTEMS AND METHODS", which is incorporated herein by reference in its entirety for all purposes.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Some of the memory devices include memory cells that may be accessed by turning on a transistor that couples the memory cell (e.g., a capacitor) with a wordline or a bitline. In contrast, threshold-type memory devices include memory devices that are accessed by providing a voltage across a memory cell, where the data value is stored based on the threshold voltage of the memory cell. For example, the data value may be based on whether the threshold voltage of the memory cell is exceeded and, in response to a sense voltage provided across the memory cell, the memory cell conducts current, which may be measured to determine the logical state of the memory cell. The data value stored may be changed, such as by applying a voltage sufficient to change the physical/electrical properties of the memory cell (e.g., at or above the threshold corresponding to the desired state). Examples of a threshold-type memory cell may include, but are not limited to, cross-point memory cells and chalcogenide memory cells (e.g., phase change memory (PCM), programmable metallization cell (PMC) memory, etc.).

With threshold-type memories, the threshold voltage of a memory cell may change over the lifetime of the memory cell depending on how many cycles (e.g., read and/or write operations) the memory cell has undergone. As such, an approach that tracks the shift in threshold voltage and/or the number of memory cell cycles may be desired.

BRIEF DESCRIPTION OF THE DRAWINGS

Various aspects of this disclosure may be better understood upon reading the following detailed description and upon reference to the drawings in which.

DETAILED DESCRIPTION

Figure 1:
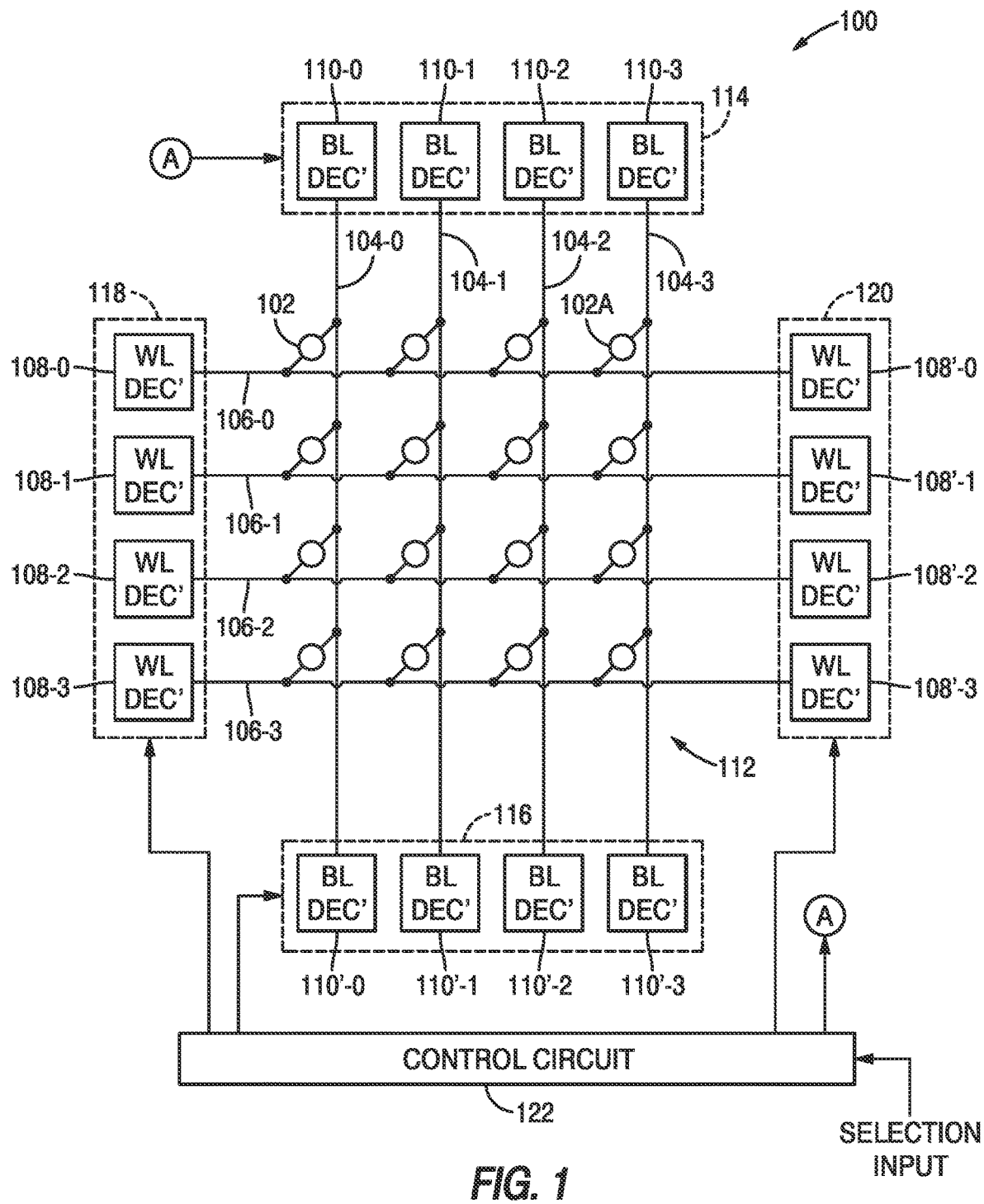
FIG. 1 is a block diagram of a portion of a memory device, in accordance with an embodiment.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memories generally include an array of memory cells with each memory cell coupled to at least two access lines. For example, a memory cell may be coupled to a bitline and a wordline. As such, each access line may be coupled to a large number of memory cells. To select a memory cell, a decoder circuit associated with a first access line for the memory cell and a decoder circuit associated with a second access line for the memory cell may both provide a voltage and/or a current on the respective access lines. By applying voltages/currents to the respective access lines, the memory cell may be accessed, such as to write data to the memory cell and/or read data from the memory cell.

In some embodiments, a threshold-type memory may utilize materials (e.g., chalcogenide glass) that change properties based on an applied threshold voltage. In other words, threshold-type memory device materials may be "Set" or "Reset" by applying particular voltages. In some embodiments, phase-changing memory (PCM) may store the data value by altering a state of the memory material. For example, the Set of a memory cell may place the phase-changing material in a first state (e.g., a crystalline state), and the Reset of the memory cell may place the phase-changing material in another state (e.g., an amorphous state). As should be appreciated, the definition of Sets and Resets may vary by convention. Furthermore, the change in state may correspond to a change of electrical properties (e.g., resistivity) of the memory cell. The current state of the memory cell, and therefore the data value of the memory cell (e.g., a logic value such as "0" or "1"), may be determined by an application of a sense voltage across the memory cell. The differing electrical properties of the phase-change material in its respective states may yield different current flows across the memory cell in response to the applied voltage. For example, when the voltage differential across the memory cell (e.g., the sense voltage or demarcation voltage) is applied, the current flow may correspond to the Set or Reset resistivity of the memory cell, and, as such, the measured current flow may be used to determine the data value of the memory cell.

Moreover, threshold-type memory devices may utilize programmable metallization cells (PMC) that exhibit a change in electrical properties (e.g., resistivity) in response to different applied voltages, which may be of opposite polarity. For example, a PMC may be programmed as a Set by applying a first voltage at or above a Set threshold voltage, and programmed as a Reset by applying a second voltage with an opposite polarity (e.g., negative polarity) relative to the first voltage. Similar to PCM, PMCs may exhibit an increase or decrease in resistivity based on the applied voltages. For example, when the sense voltage is applied, the current flow may correspond to the Set or Reset resistivity of the memory cell, and, as such, the measured current flow may be used to determine the data value of the memory cell.

The threshold voltages may define reference voltages that, when a voltage is applied across a memory cell above (or below depending on circumstances and implementation) a respective threshold, cause a memory cell to be programmed as a Set or Reset. As should be appreciated, different materials may have different threshold voltages, and some Sets or Resets may have thresholds bound on either end, such as in some PCM. In some scenarios, Set and/or Reset threshold voltages (e.g., voltage differentials as taken across the memory cell) may vary from cell to cell, for example, due to non-uniformity in hardware, material, or previously applied voltages (e.g., during reads and/or writes). As such, the threshold voltages for each of the Sets and Resets may be considered as voltage distributions with the sense voltage (e.g., an applied voltage for reading a Set or Reset) generally between the voltage distributions and used to read the logical state of the memory cell.

Additionally, in some scenarios, the threshold voltage distributions for Sets and/or Resets of a memory cell may change over the life of the memory cell based on the number of cycles (e.g., write and/or read operations) the memory cell has undergone. In other words, the electrical properties of the memory cell may change based on the number of cycles the memory cell has been through, which may alter the threshold voltage. In some scenarios, the change in threshold voltage distributions for memory cells that have undergone many cycles may cause, when the memory cell is read, the applied sense voltage to reach the threshold voltage and change the state of the memory cell, which may lead to an improperly interpreted data value.

In some embodiments, to compensate for the change in threshold voltage distributions due to cycling of the memory cell, the amount of cycles may be tracked (e.g., via multiple registers), and the sense voltage may be adjusted based on the amount of cycles the memory cell has undergone. Moreover, the memory bank may be segmented into multiple blocks, each corresponding to a set of memory addresses. For example, a register may be assigned a memory block such that the register keeps track of reads and/or writes the memory cells of the memory block. To read the memory cell, the register corresponding to the memory address of the memory cell may be referenced, and an appropriate sense voltage may be selected based on the number of cycles the register has tracked for the corresponding memory block. Although discussed above as relating to phase-change memory and programmable metallization cells, the techniques discussed herein may be applied to any suitable memory device where the threshold voltage changes over cycles of the memory cells and/or where the number of cycles/operations is of interest.

With the foregoing in mind, FIG. 1 is a block diagram of a portion of a memory device 100. The memory device 100 may be any suitable form of memory, such as non-volatile memory (e.g., a cross-point memory) and/or volatile memory. The memory device 100 may include one or more memory cells 102, one or more bitlines 104 (e.g., 104-0, 104-1, 104-2, 104-3), one or more wordlines 106 (e.g., 106-0, 106-1, 106-2, 106-3), one or more wordline decoders 108 (e.g., wordline decoding circuitry), and one or more bitline decoders 110 (e.g., bitline decoding circuitry). The memory cells 102, bitlines 104, wordlines 106, wordline decoders 108, and bitline decoders 110 may form a memory array 112.

Each of the memory cells 102 may include a selector and/or a storage element. When a voltage across a selector of a respective memory cell reaches a threshold, the storage element may be accessed to read a data value from and/or write a data value to the storage element. In some embodiments, each of the memory cells 102 may not include a separate selector and storage element, and have a configuration such that the memory cell nonetheless acts as having a selector and storage element (e.g., may include use of a material that behaves both like a selector material and a storage element material). When memory cells 102 have a single material that functions as a selector and storage element, these architectures may leverage single material (e.g., chalcogenide) process architectures and may have respective values set within each memory cell by leveraging positive signals (e.g., positive voltages, positive currents) to set a logic high value in the memory cell and by leveraging negative signals or lower voltage signals (e.g., negative voltages, negative currents) to clear a logic high value or set a logic low value in the memory cell. Single material process architectures may use bipolar decoders (e.g., driving circuitry) to access the memory cell during a memory operation. In some cases, unipolar decoders may be used, such as when a neutral mid-point between a positive signal level and a negative signal level is shifted to equal half a voltage difference between the bitlines 104 and wordlines 106.

For ease of discussion, FIG. 1 may be discussed in terms of bitlines 104, wordlines 106, wordline decoders 108, and bitline decoders 110, but these designations are non-limiting. The scope of the present disclosure should be understood to cover memory cells 102 that are coupled to multiple access lines and accessed through respective decoders, where an access line may be used to store data into a memory cell and read data from the memory cell.

The bitline decoders 110 may be organized in multiple groups of decoders. For example, the memory device 100 may include a first group of bitline decoders 114 (e.g., multiple bitline decoders 110) and/or a second group of bitline decoders 116 (e.g., different group of multiple bitline decoders 110'). Similarly, the wordline decoders 108 may also be arranged into groups of wordline decoders 108, such as a first group of wordline decoders 118 and/or a second group of wordline decoders 120. Decoders may be used in combination with each other to drive the memory cells 102 (e.g., such as in pairs and/or pairs of pairs on either side of the wordlines 106 and/or bitlines 104). For example, bitline decoder 110-3 may operate in conjunction with bitline decoder 110'-3 and/or with wordline decoders 108-0, 108'-0 to select the memory cell 102A. As may be appreciated herein, decoder circuitry on either ends of the wordlines 106 and/or bitlines 104 may be different. Additionally, it is noted that the depicted components of the memory device 100 may include additional circuitry not shown and/or may be disposed in any suitable arrangement. For example, a subset of the wordline decoders 108 and/or bitline decoders 110 may be disposed on different sides of the memory array 112 and/or on a different physical side of any plane including the circuitries.

The memory device 100 may also include a control circuit 122. The control circuit 122 may communicatively couple to respective wordline decoders 108 and/or bitline decoders 110 to perform memory operations by, for example, causing the decoding circuitry (e.g., a subset of the wordline decoders 108 and/or bitline decoders 110) to generate selection signals (e.g., selection voltage and/or selection currents) for programming a target of the memory cells. In some embodiments, a positive voltage and a negative voltage may be provided on one or more of the bitlines 104 and/or wordlines 106, respectively, to a target of the memory cells 102. In some embodiments, the decoder circuits may provide electrical pulses (e.g., voltage and/or current) to the access lines to access the memory cell. The electrical pulse may be a square pulse, or in other embodiments, other shaped pulses may be used. In some embodiments, a voltage provided to the access lines may be a constant voltage.

Activating the decoder circuits may enable the delivery of an applied voltage (e.g., an electrical pulse) to the target of the memory cells 102 such that the control circuit 122 is able to access data storage of the target memory cell, such as to read from or write to the memory cell. After a target of the memory cells 102 is accessed, data may be read or written. Writing to the target memory cell may include changing the data value stored by the target memory cell. As previously discussed, the data value stored by a memory cell may be based on a threshold voltage. In some embodiments, a memory cell may be Set to have a logical "0", or may be Reset to have a logical "1" depending on convention. In some embodiments, a Set memory cell may have a lower threshold voltage than a Reset memory cell, however, as should be appreciated, convention of logical values and/or convention of how voltage polarity is determined (e.g., either positive or negative) may be implementation specific and does not limit the present disclosure. Regardless of convention, by Setting or Resetting a memory cell, different data values may be stored by the memory cell. Reading a target of the memory cells 102 may include determining whether the target memory cell was characterized by the first threshold voltage and/or by the second threshold voltage by sensing a current flow in response to an applied sense voltage across the memory cell 102. During programming (e.g., writing), the threshold voltage for a particular memory cell (e.g., memory cell 102A) may be reached by applying programming pulses with either positive or negative polarity to the memory cell 102A and reading the memory cell 102A using a signal with a given (e.g., known) fixed polarity.

Figure 2:
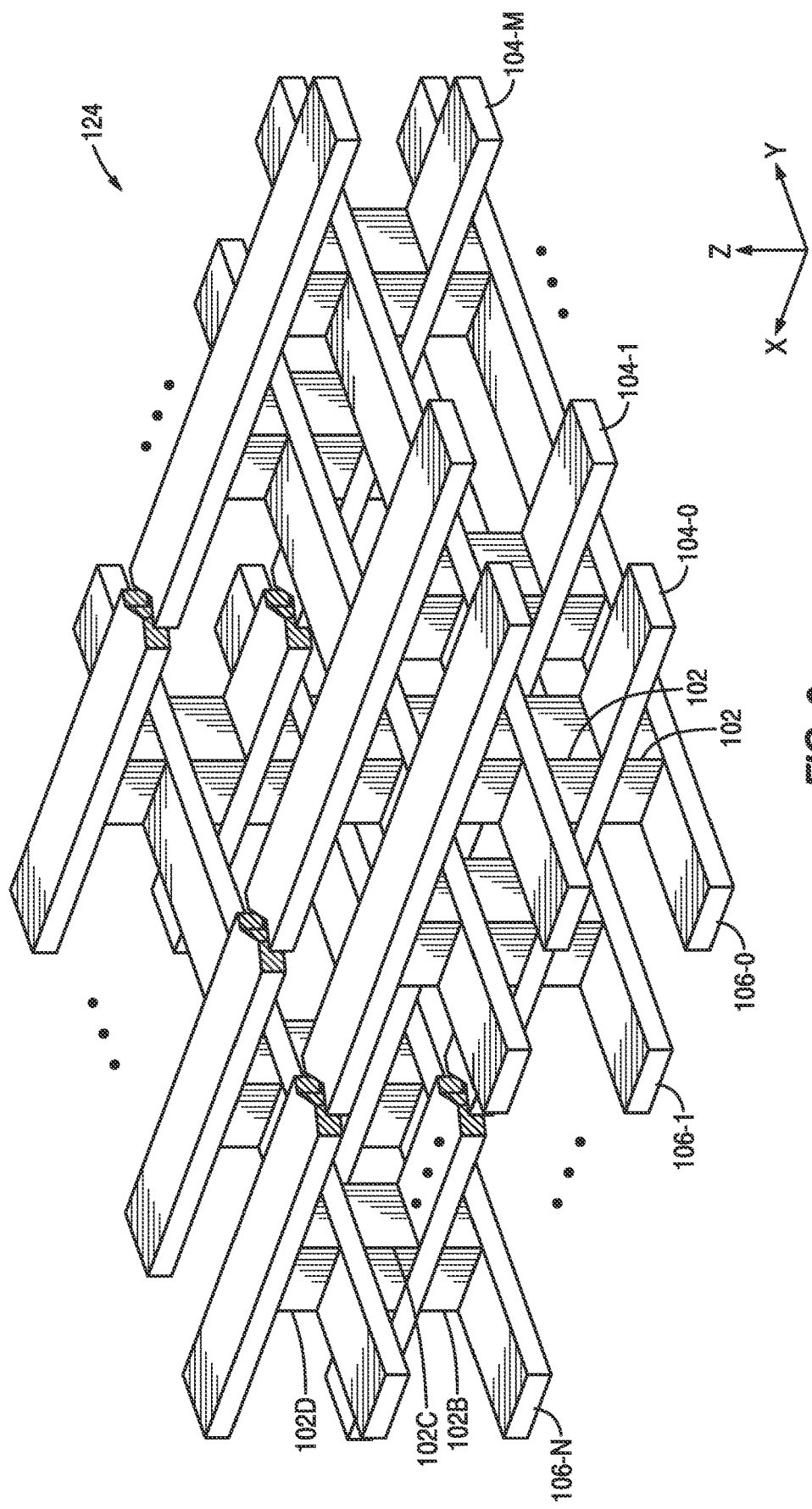
FIG. 2 is a diagram of the portion of the memory device of FIG. 1, in accordance with an embodiment.

FIG. 2 is a diagram illustrating a portion of a memory array 124 in accordance with an embodiment of the present disclosure. The memory array 124 may be a cross-point array including wordlines 106 (e.g., 106-0, 106-1, . . . , 106-N) and bitlines 104 (e.g., 104-0, 104-1, . . . , 104-M). A memory cell 102 may be located at each of the intersections of the wordlines 106 and bitlines 104. The memory cells 102 may function in a two-terminal architecture (e.g., with a particular of the wordlines 106 and the bitlines 104 serving as the electrodes for a particular of the memory cells 102).

Each of the memory cells 102 may be resistance variable memory cells, such as resistive random-access memory (RRAM) cells, conductive-bridging random access memory (CBRAM) cells, phase-change memory (PCM) cells, and/or spin-transfer torque magnetic random-access memory (STT-RAM) cells, among other types of memory cells. Each of the memory cells 102 may include a memory element (e.g., memory material) and a selector element (e.g., a select/storage material (SD)) and/or a material layer that functionally replaces a separate memory element layer and selector element layer. The selector element (e.g., SD material) may be disposed between a wordline contact and a bitline contact associated with a wordline or bitline forming the memory cell. Electrical signals may transmit between the wordline contact and the bitline contact when reading or writing operations are performed to the memory cell.

The selector element may be a diode, a non-ohmic device (NOD), or a chalcogenide switching device, among others, or formed similar to the underlying cell structure. The selector element may include, in some examples, selector material, a first electrode material, and a second electrode material. The memory element of memory cell 102 may include a memory portion of the memory cell 102 (e.g., the portion programmable to different states). For instance, in resistance variable memory cells 102, a memory element can include the portion of the memory cell having a resistance that is programmable to particular levels corresponding to particular states responsive to applied programming voltage and/or current pulses. In some embodiments, the memory cells 102 may be characterized as threshold-type memory cells that are selected (e.g., activated) based on a voltage and/or current crossing a threshold associated with the selector element and/or the memory element. Embodiments are not limited to a particular resistance variable material or materials associated with the memory elements of the memory cells 102. For example, the resistance variable material may be a chalcogenide formed of various doped or undoped chalcogenide-based materials. Other examples of resistance variable materials that may be used to form storage elements include binary metal oxide materials, colossal magnetoresistive materials, and/or various polymer-based resistance variable materials, among others.

In operation, the memory cells 102 may be programmed by applying a voltage (e.g., a write voltage) across the memory cells 102 via selected wordlines 106 and bitlines 104. A sensing (e.g., read) operation may be performed to determine a state of one or more memory cells 102 by sensing current or voltage. For example, the current/voltage may be sensed on one or more bitlines 104 corresponding to the respective memory cells 102 in response to a particular voltage applied to the selected of the wordlines 106 forming the respective memory cells 102.

As illustrated, the memory array 124 may be arranged in a cross-point memory array architecture (e.g., a three-dimensional (3D) cross-point memory array architecture) that extends in any direction (e.g., x-axis, y-axis, z-axis). The multi-deck cross-point memory array 124 may include a number of successive memory cells (e.g., 102B, 102C, 102D) disposed between alternating (e.g., interleaved) decks of wordlines 106 and bitlines 104. The number of decks may be expanded in number or may be reduced in number and should not be limited to the depicted volume or arrangement. Each of the memory cells 102 may be formed between wordlines 106 and bitlines 104 (e.g., between two access lines), such that a respective one of the memory cells 102 may be directly electrically coupled with (e.g., electrically coupled in series) with its respective pair of the bitlines 104 and wordlines 106 and/or formed from electrodes (e.g., contacts) made by a respective portion of metal of a respective pair of bitlines 104 and wordlines 106. For example, the memory array 124 may include a three-dimensional matrix of individually-addressable (e.g., randomly accessible) memory cells 102 that may be accessed for data operations (e.g., sense and write) at a granularity as small as a single storage element and/or multiple storage elements. As should be appreciated, the memory array 124 may include more or less bitlines 104, wordlines 106, and/or memory cells 102 than shown in the examples of FIG. 2.

Figure 3:
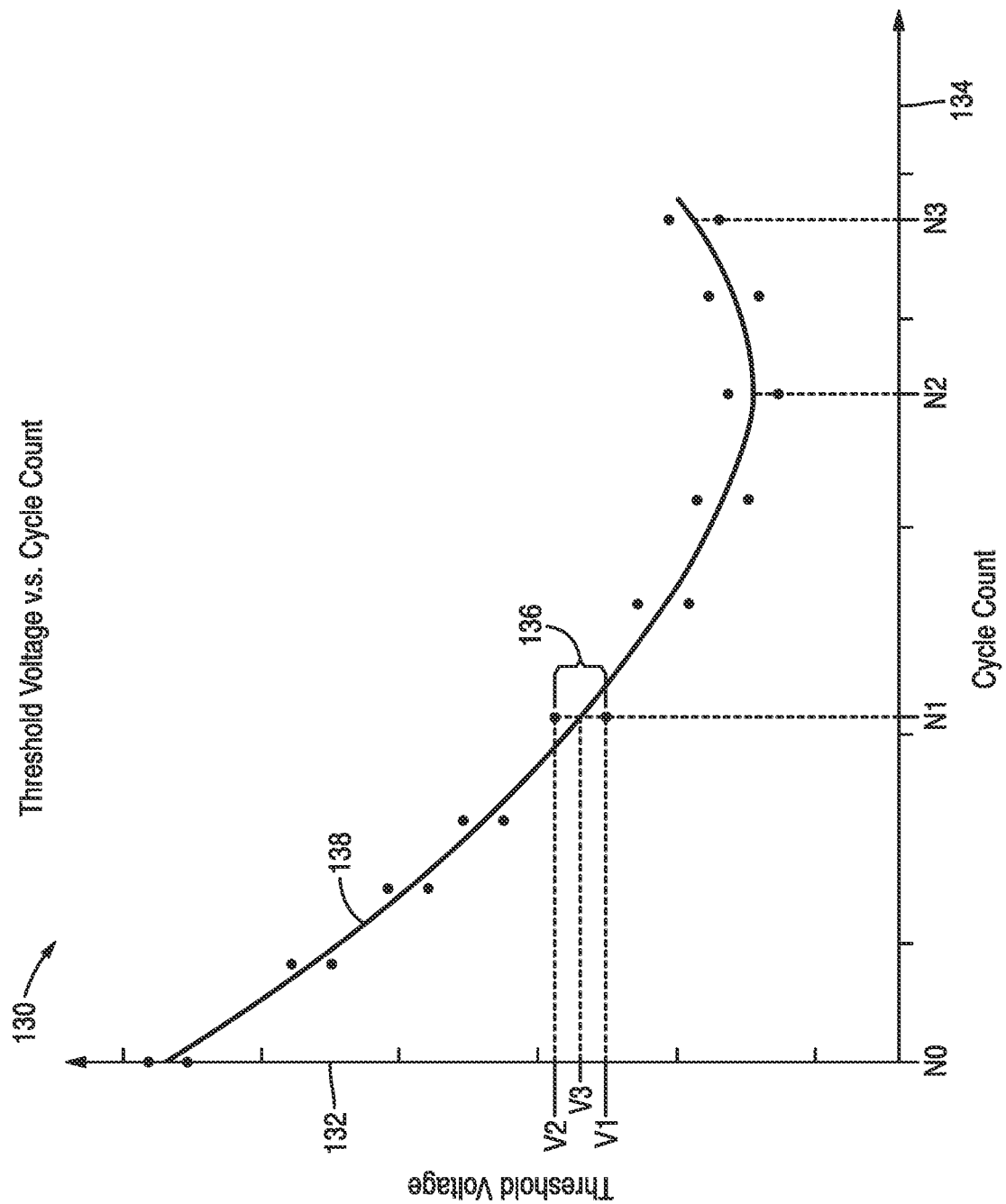
FIG. 3 is a graph of threshold voltage as cycle count increases, in accordance with an embodiment.

As discussed above, in some scenarios, Set and/or Reset threshold voltages may vary, for example, due to non-uniformity in hardware, the applied voltages (e.g., during reads and/or writes), and/or the material of the memory cell 102. Additionally, the threshold voltage distributions for Sets and/or Resets of a particular memory cell 102 may change based on how many cycles the particular memory cell 102 has undergone. To help illustrate, FIG. 3 is a generalized graph 130 of a threshold voltage 132 for a Set/Reset of a memory cell 102 as the cycle count 134 increases, from a beginning reference cycle count 134 (e.g., cycle count N0), throughout the life of the memory cell 102. The generalized graph 130 includes a normalized cycle count 134 on the x-axis and normalized threshold voltage 132 on the y-axis. As should be appreciated, the generalized graph 130 illustrates the threshold voltage 132 for a Set and/or a Reset over multiple cycles, and particular implementations may exhibit additional and/or different characteristics over the cycle count 134.

The threshold voltage 132 may have a distribution 136 around a mean threshold voltage 138. For example, for memory cells 102 at a given cycle count 134 (e.g., cycle count N1), the distribution 136 of threshold voltages 132 for the memory cells 102 may statistically vary from a first voltage (e.g., V1) to a second voltage (e.g., V2) with a mean threshold voltage 138 (e.g., V3) therebetween. Furthermore, as the cycle count 134 increases, the distribution 136 of the threshold voltage 132 may generally follow a path that includes one or more increases and/or decreases throughout the life of a memory cell 102. For example, as the cycle count 134 increases (e.g., from cycle count N0 to N1 to N2) the threshold voltage 132 may generally decrease. Additionally, during other portions of the life of the memory cell 102 (e.g., from cycle count N2 to N3), the threshold voltage 132 may generally increase. Moreover, a memory cell 102 may undergo a period of decreasing threshold voltage 132 followed by a period of increasing threshold voltage 132, as exampled in FIG. 3, or vice versa. As should be appreciated, the path and/or speed of the change in threshold voltage 132 as the cycle count 134 increases or decreases may vary depending on implementation (e.g., material, operating voltages, etc.) and/or environmental factors (e.g., temperature). For a given path, the cycle count 134 may be tracked to compensate for the change in threshold voltage 132.

Figure 4:
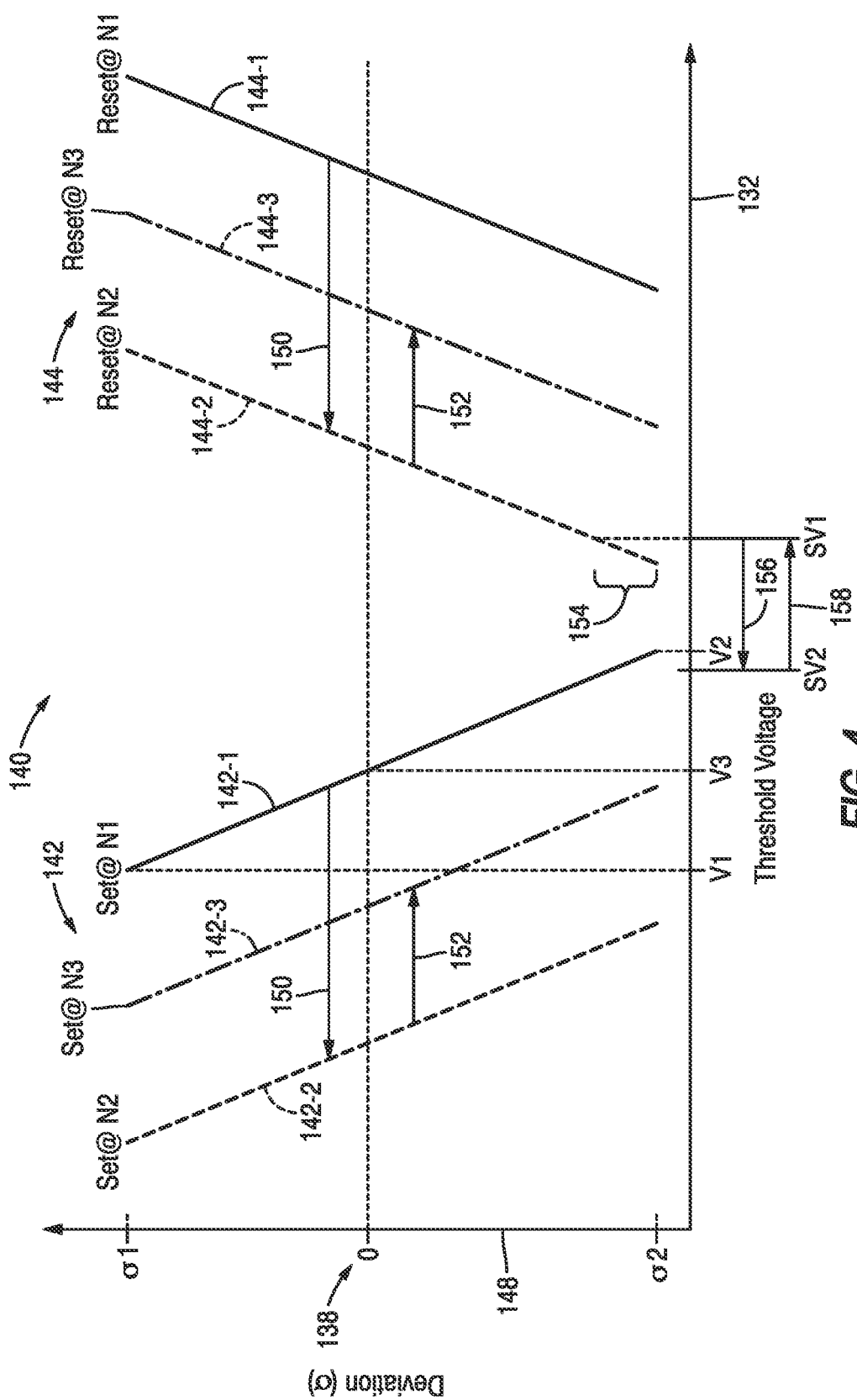
FIG. 4 is a graph of example sense voltages in relation to Set and Reset voltage distributions, in accordance with an embodiment.

In further illustration, FIG. 4 is a graph 140 of Set voltage distributions 142 and Reset voltage distributions 144 at three separate cycle counts 134 (e.g., Set voltage distributions 142-1, 142-2, and 142-2 at cycle counts N1, N2, and N3, respectively, and Reset voltage distributions 144-1, 144-2, and 144-3 at cycle counts N1, N2, and N3, respectively). As should be appreciated, the threshold voltages 132 at the respective cycle counts N1, N2, and N3, are given as examples, and, as discussed above, the increases or decreases in threshold voltage 132 may occur at different relative times in the cycle count 134 of a memory cell 102. The graph 140 includes threshold voltage 132 on the x-axis and standard deviation 148 from the mean threshold voltage 138 for given cycle counts 134 on the y-axis.

In further illustration and in conjunction with FIG. 3, the Set voltage distribution 142-1 for a memory cell 102 having a cycle count N1 may have a mean threshold voltage 138, represented as voltage V3, and vary between voltage V1 and voltage V2 for a given standard deviation 148 (e.g., a standard deviation between σ1 and σ2). The Reset voltage distributions 144 may be similarly bound for a given standard deviation 148.

In some scenarios, the Set voltage distributions 142 and Reset voltage distributions 144 for may experience a voltage downshift 150 as the cycle count 134 increases. The voltage downshift 150 may be based on multiple different factors such as material properties of the memory cell 102, the electrical pulses imposed on the memory cell 102 during operation, environmental factors (e.g., temperature), manufacturing factors, or a combination thereof. Moreover, in some scenarios, as the cycle count 134 increases (e.g., from cycle count N2 to N3) a voltage upshift 152 may occur, opposite the voltage downshift 150. As such, the threshold voltage 132 for a particular memory cell 102 may undergo one or more voltage upshifts 152 and/or one or more voltage downshifts 150 as the cycle count 134 of the particular memory cell 102 increases. Moreover, although exampled as undergoing a voltage downshift 150 and then a voltage upshift 152, the order, frequency, and/or rate of the voltage downshifts 150 and upshifts 152 may depend on implementation. Additionally, although exampled has having the same voltage downshift 150 and then a voltage upshift 152, the magnitudes of the voltage downshift 150 and/or voltage upshift 152 may be different for Set voltage distributions 142 and Reset voltage distributions 144 and may vary depending on the cycle count 134.

In general, a sense voltage (e.g., SV1) may be disposed between the Set voltage distributions 142 (e.g., Set voltage distribution 142-1) and Reset voltage distributions 144 (e.g., Reset voltage distribution 144-1) for a given cycle count 134 (e.g., cycle count N1). In some scenarios, the voltage downshift 150 in the Reset voltage distributions 144 (e.g., from Reset voltage distribution 144-1 at cycle count N1 to Reset voltage distribution 144-2 at cycle count N2) may cause a portion 154 of the Reset voltage distribution 144 to shift past the sense voltage (e.g., sense voltage SV1). The portion 154 of the Reset voltage distribution 144 shifted past the sense voltage (e.g., sense voltage SV1) may statistically correspond to a portion of the memory cells 102 that, when read, may be improperly interpreted as a Set instead of a Reset. As such, in accordance with present embodiments, facilitating a sense voltage downshift 156 based on the cycle count 134 of the memory cell 102 may facilitate increased proper interpretation of the data in the memory cells 102. Similarly, a sense voltage upshift 158 may be determined based on the cycle count 134 to account for voltage upshifts 152.

In some embodiments, to compensate for the voltage downshift 150 and/or voltage upshift 152 in Set voltage distributions 142 and Reset voltage distributions 144 as cycle count 134 increases, the number of cycles (e.g., operations such as reads and/or writes) may be tracked (e.g., via registers, a processor, the control circuit 122, or a combination thereof), and the sense voltage (e.g., SV1 or SV2) may be adjusted (e.g., via a sense voltage downshift 156 or a sense voltage upshift 158) based on the tracked cycle count 134. For example, at cycle count N1 the first sense voltage SV1 may be used, and at cycle count N2 a second sense voltage SV2 may be used to minimize or eliminate the portion 154 of potentially improperly interpreted memory cells 102. Moreover, in response to voltage upshift 152, the sense voltage may undergo sense upshift 158 to account for the change in threshold voltage 132. As should be appreciated, the graph 140 is depicted as an illustrative tool, and may not be to scale. Additionally, the mean threshold voltage 138, Set voltage distributions 142, and/or Reset voltage distributions 144 may be linear or non-linear and may vary based on implementation (e.g., material properties, applied voltages, ambient/operating temperature, etc.). Furthermore, as discussed above, the order, frequency, and/or rate of the voltage downshifts 150 and upshifts 152 may vary, and, as such, the order, frequency, and/or amount of sense voltage downshifts 156 and/or sense voltage downshifts 158 may vary accordingly.

In addition to helping reduce the probability of improperly interpreting memory cells 102 (e.g., during read operations), keeping track of the cycle count 134 and tracking the voltage downshift 150 and/or voltage upshift 152 may also be used during write operations. For example, the voltage used for a pre-read may undergo sense voltage downshift 156 and/or sense voltage upshift 158, and may use the same or different sense voltages (e.g., SV1 or SV2) as those during read operations. Additionally, the cycle count 134 of the memory cell 102 may be used to determine increased or decreased selection voltages (e.g., for applying voltages at respective threshold voltages for a Set or Reset). For example, as the cycle count 134 increases and the voltage downshift 150 increases, the memory cell may require a lower selection voltage (or higher in the case of voltage upshift 152) in order to access or program the memory cell 102 due to the shifted threshold voltage 132, which may provide power savings and/or generate less heat.

Figure 5:
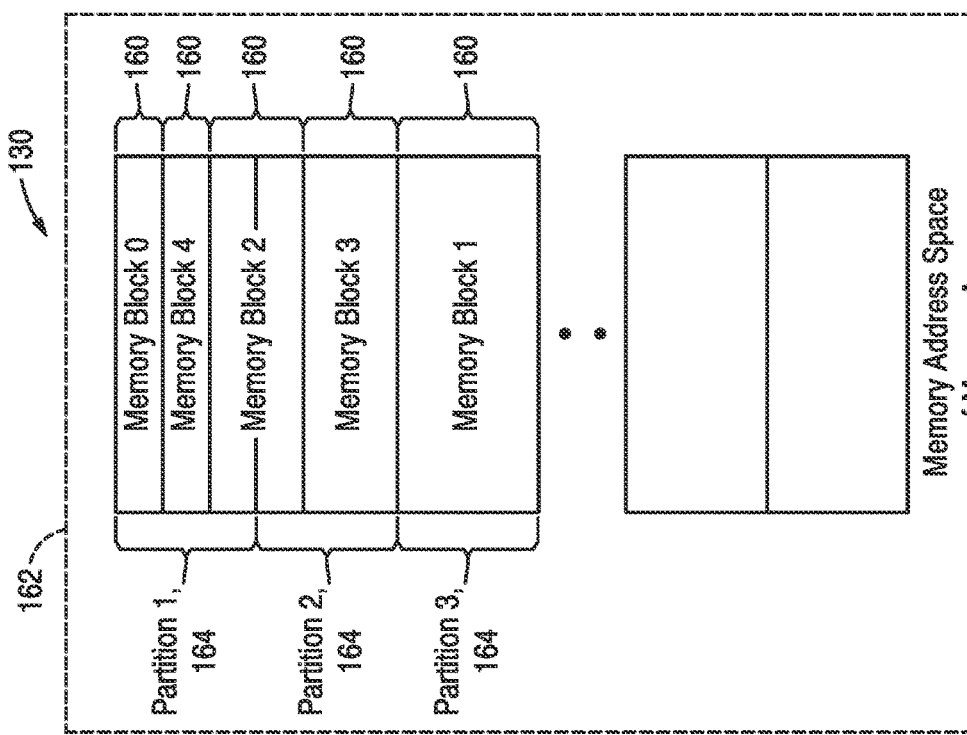
FIG. 5 is a block diagram of example memory block assignments in a memory array, in accordance with an embodiment.

In some scenarios, it may not be feasible to track the cycle count 134 for each memory cell 102 individually. As such, the memory array 124 may be divided into multiple memory blocks 160 that each include a subset of the memory addresses 162 of the memory array 124, as shown in FIG. 5. Moreover, the memory blocks 160 may be of any suitable size and may vary in size from one memory block 160 to the next. Furthermore, memory blocks 160 may transcend other memory allotments such as partitions 164. For example, the memory blocks 160 may make up a full partition 164 (e.g., Memory Block 1 and Partition 3 correspond to the same memory addresses 162), a portion of a partition 164 (e.g., Memory Block 0 is less than the full Partition 1), and/or span multiple partitions 164 (e.g., Memory Block 2 spans across Partition 1 and Partition 2).

Figure 6:
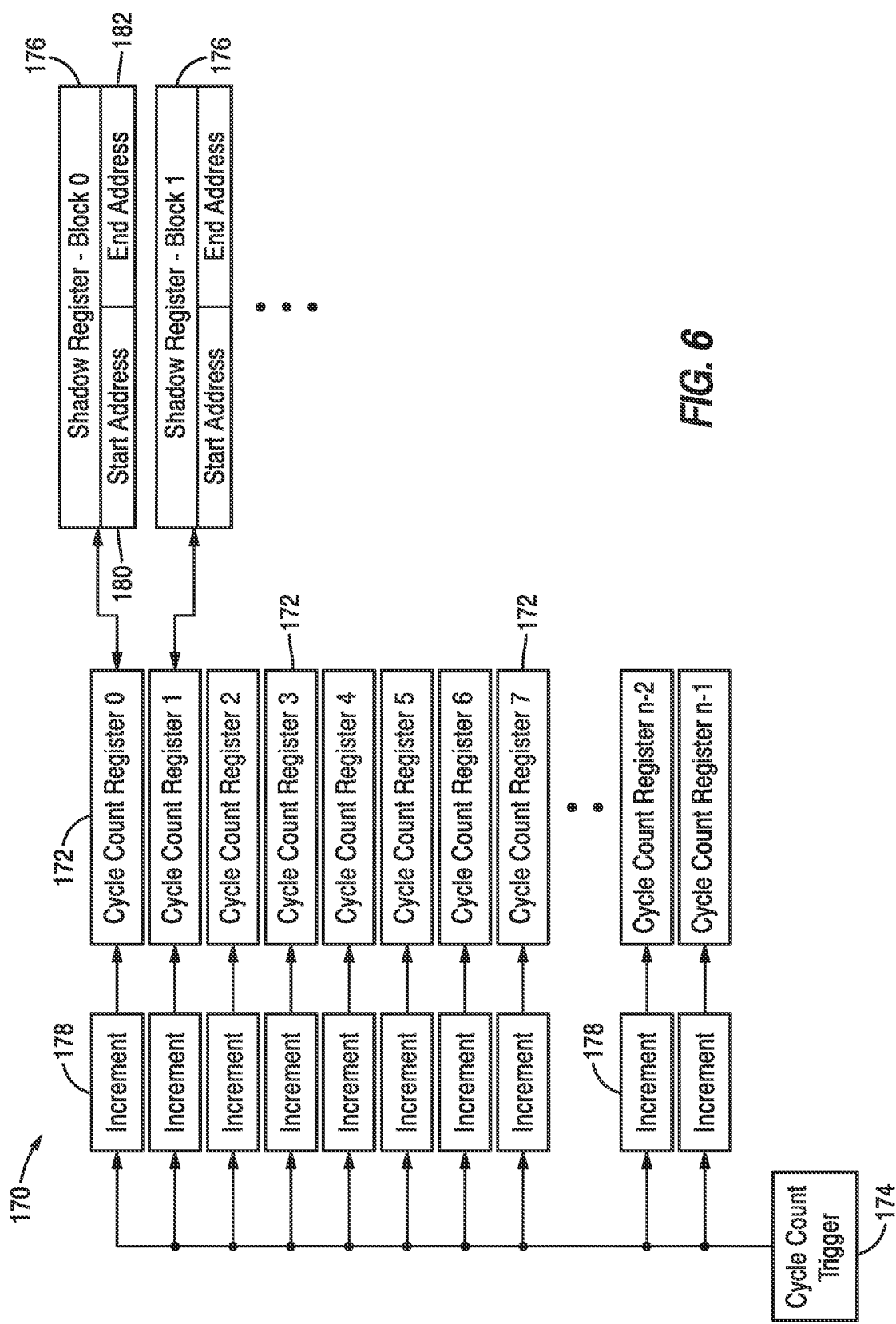
FIG. 6 is a block diagram of count tracking circuitry, in accordance with an embodiment.

Tracking of the cycle count 134 may occur on the memory device 100 and/or a memory controller of a computing system interfacing with the memory device 100. Moreover, as discussed herein, control circuitry governing and/or implementing the tracking of the cycle count 134 may be accomplished on-die (e.g., of the memory device 100), via a computing system coupled to the memory device 100 (e.g., via a processor or other circuitry), or a combination thereof. In some embodiments, implementing cycle tracking circuitry 170, as in FIG. 6, on the memory device 100 may yield increased bandwidth between the memory device 100 and the computing system. Additionally, in some embodiments, streamlining the determination of what sense voltage (e.g., sense voltage SV1 or SV2) to use (e.g., using on-die cycle tracking circuitry) may increase operational efficiency and/or increase speed of the memory device 100 and/or a computing device coupled thereto. The cycle tracking circuitry 170 may include multiple cycle count registers 172, to track the number of cycles for each memory block 160, and a cycle count trigger 174 to increment the number of counts stored in the cycle count registers 172. Additionally, each cycle count register 172 may have one or more corresponding shadow registers 176 to keep track of which memory addresses 162 correspond to which cycle count registers 172. As the memory cells 102 of a particular memory block 160 undergo a cycle, count increments 178, generated by the cycle count trigger 174, may update the cycle count registers 172 to increase the tracked cycle count 134 of the particular memory block 160.

In some scenarios, different operations (e.g., writes, reads, pre-reads, etc.) may have different effects on the voltage downshift 150 and/or voltage upshift 152. For example, a write may be associated with a higher applied voltage to the memory cell 102 than a read and, therefore, may do more to cause voltage downshift 150 and/or voltage upshift 152 than a read operation. In some embodiments, the cycle count trigger 174 may differentiate different operations as causing more or fewer cycles. For example, the cycle count trigger 174 may generate an increment 178 of one cycle in response to a read operation and generate multiple increments 178, or a single increment 178 with higher magnitude, corresponding to multiple cycles in response to a write operation. The ratio of counts of the different operations (e.g., 10 to 1, 100 to 1, etc.) may vary depending on the properties of the memory cell material and/or other implementation factors.

Furthermore, memory blocks 160 may be assigned and reassigned regardless of order. In other words, as different sections of the memory array 124 are written to, the cycle count registers 172 may be assigned or reassigned on-the-fly to maintain accurate cycle counts. For example, if data is written to a portion of the memory array 124, the memory device 100 or the computing system interfaced therewith may assign a cycle count register 172 to the memory addresses 162 corresponding to that portion of the memory array 124 by storing the memory addresses 162 in the shadow register 176 corresponding to the cycle count register 172. Additionally, the write operation may trigger the cycle count trigger 174 to generate an increment 178 of the cycle count register 172 associated with that memory block 160. Subsequent operations on the memory cells 102 of the memory block 160 may then cause additional increments 178 of the associated cycle count register 172.

In some embodiments, the memory addresses 162 of the corresponding memory block 160 may include a contiguous set of memory addresses 162 with a single start address 180 and a single end address 182. As should be appreciated, however, in some embodiments, a memory block 160 may include multiple sub-blocks of consecutive memory addresses 162 that may be non-consecutive, and multiple shadow registers 176, corresponding to the cycle count register 172 of the memory block 160, may store the start addresses 180 and end addresses 182 of the sub-blocks. Additionally, the cycle count registers 172 may be reassigned to maintain an accurate approximation of the cycle count 134 of operations as data is written and read. Reassignment of the cycle count registers 172 may include merging or splitting of memory blocks 160. For example, during write operations, the control circuit 122 of the memory device 100 or the computing system may assign to a particular cycle count register 172 memory addresses 162 that encompass or overlap one or more previously defined memory blocks 160 corresponding to the particular cycle count register 172 and/or additional cycle count registers 172. As such, the start addresses 180 and end addresses 182 of the previously defined memory blocks 160 may be adjusted to make way for the new memory block 160 of the new data. Additionally, the value of the cycle count register 172 of the usurped memory cells 102 may be added (e.g., via an average, a weighted average, or other formulaic combination) to the cycle count register 172 of the newly addressed memory block 160. Further, if a cycle count register 172 is not assigned a memory block 160 (e.g., its previous memory block 160 was overtaken by another memory block) it may enter an idle state, and the corresponding shadow register(s) 176 may be reset or cleared. Moreover, during a split of a memory block 160 (e.g., due to a write of new data that uses only a portion of the memory cells 102 of the memory block 160) the untouched memory cells may stay with the original memory block 160 and maintain their original cycle count 134, and the newly assigned cycle count register 172 may be updated to the original cycle count 134 and incremented according to the operation. As should be appreciated not all writes need to be associated with a new assignment or reassignment of a memory block 160. For example, new data may be written within one memory block 160 or across multiple memory blocks, and the cycle count register 172 may be updated for each memory block 160 having an operation done on one or more of its associated memory cells 102.

The number of cycle count registers 172 may correspond to the size of the memory array 124 as well as other implementation factors (e.g., estimated size of the average write, estimated write frequency, etc.). Recycling/reassignment of the cycle count registers 172 as discussed above, may help reduce the number of cycle count registers 172 in a particular implementation. Additionally, if additional cycle count registers 172 are desired, the control circuit 122 of the memory device 100 or the computing system may refresh (e.g., rewrite) the data of multiple consecutive memory blocks 160 into a single memory block 160 tracked by a single cycle count register 172 and reassign the unused cycle count registers 172. Additionally or alternatively, multiple consecutive memory blocks 160 may be merged into a single memory block 160 tracked by a single cycle count register 172 by averaging the cycle counts 134 of the merged memory blocks 160. The average may be weighted based on the cycle counts 134 and/or the sizes of the corresponding memory blocks 160. Additionally, in some embodiments, merging of the memory blocks 160 may be subject to qualifications such as a maximum cycle count 134 of either of memory blocks 160 to be merged and/or a maximum difference between the cycle counts 134 of the memory blocks 160 to be merged.

Upon initialization of a new memory device 100, the cycle count 134 of the cycle count registers 172 may start at a relative zero point. From the relative zero point, the cycle count 134 stored in the cycle count registers 172 may be updated via the count increments 178 generated by the cycle count trigger 174. The count increments 178 may be of any suitable granularity and, as discussed above, may differ based on the associated operation. Moreover, the cycle count trigger 174 may be part of the cycle tracking circuitry 170 implemented on-die or the count increments 178 may be received from control circuitry of a computing system coupled to the memory device 100. In the case of power shutdowns, either intentional or unexpected, the computing system may store backups of the cycle counts 134 for each of the memory blocks as well as the address assignments of the shadow registers 176. For example, such a backup may be part of a shutdown procedure and/or may occur periodically (e.g., at fixed or predetermined intervals) to account for unexpected shutdowns. Additionally or alternatively, the backup of the cycle counts 134 may be stored in memory on the memory device 100. Additionally or alternatively, the memory device 100 may have a supplemental power source (e.g., a battery, a capacitor, etc.) to maintain the cycle count registers 172 during power outages and shutdowns.

Figure 7:
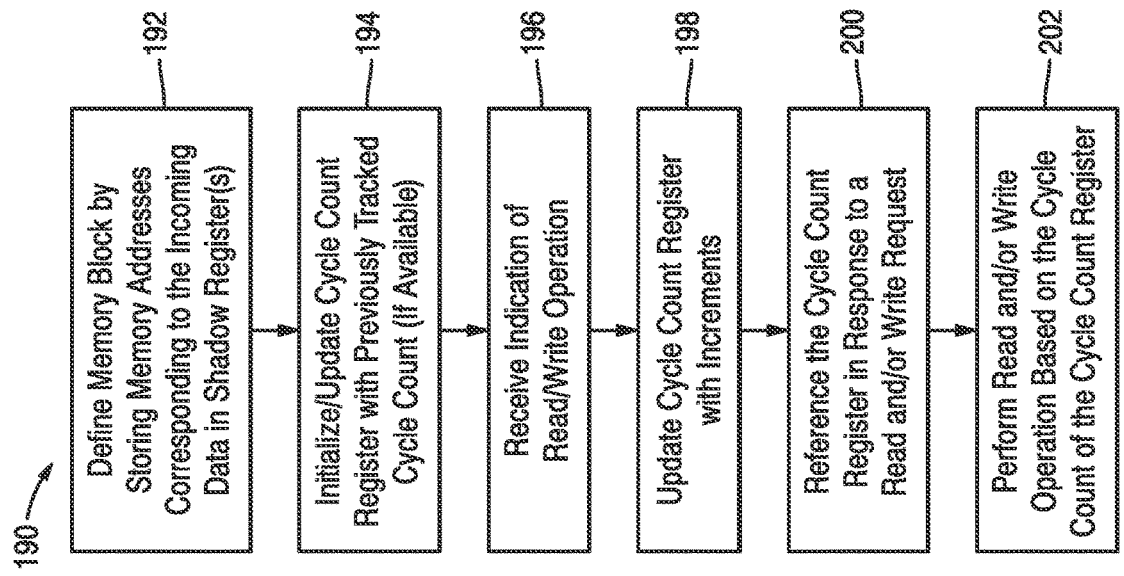
FIG. 7 is a flowchart of an example process for assigning a cycle count register to keep track of the cycle count of a set of memory cells, updating the cycle count register, and utilizing the tracked cycle count, in accordance with an embodiment.

FIG. 7 is a flowchart of an example process 190 for assigning a cycle count register 172 to keep track of the cycle count 134 of a set of memory cells, updating the cycle count register 172, and utilizing the tracked cycle count 134. In some embodiments, a memory block 160 may be defined by storing the memory addresses 162 (e.g., the start address 180 and the end address 182) corresponding tracked memory cells 102 in one or more shadow registers 176 (process block 192). The cycle count register 172 associated with the memory block 160 and shadow registers 176 may be initialized or updated with a previously tracked cycle count associated with the memory cells 102, if available (process block 194). For example, the cycle count register 172 may be updated by combining previously tracked cycle counts 134 associated with the memory cells 102, initialized as a new cycle count register 172 from previously tracked cycle counts 134, or initialized at a relative zero point if the memory cells have not been accessed before. The cycle tracking circuitry 170 may receive an indication of a read or write operation (process block 196) and update the cycle count register 172 with increments 178 accordingly (process block 198). Further, in response to read and/or write requests, the cycle count register 172 may be referenced to determine the cycle count 134 of the cycle count register 172 (process block 200). The memory device 100 may then perform the read or write operation adjusted based on the cycle count 134 of the cycle count register 172 (process block 202). Although the above referenced flowchart is shown in a given order, in certain embodiments, process blocks may be reordered, altered, deleted, and/or occur simultaneously. Additionally, the referenced flowchart is given as an illustrative tool and further decision and process blocks may also be added depending on implementation.

Figure 8:
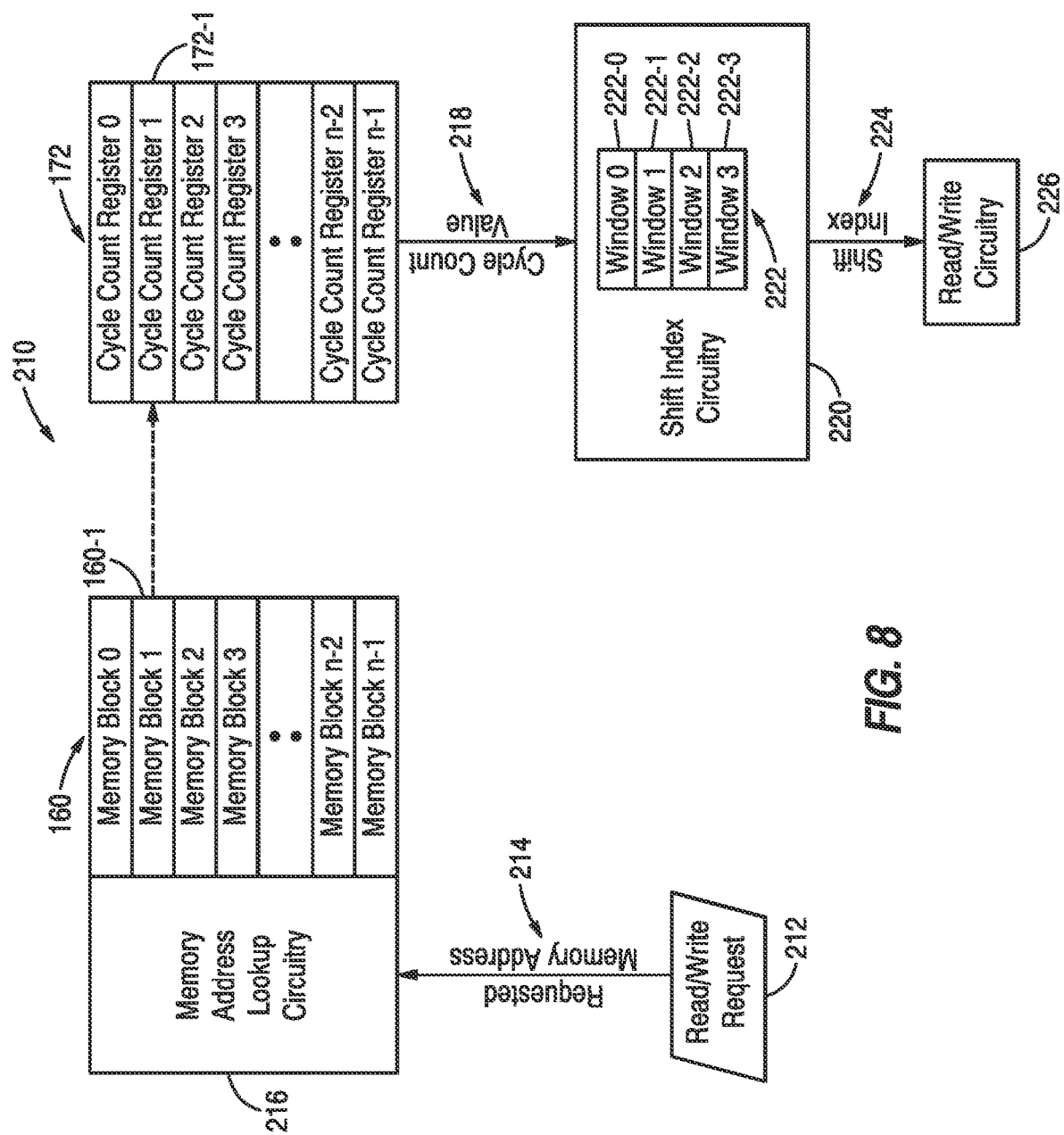
FIG. 8 is a schematic diagram of a portion of the memory device of FIG. 1 applying the cycle tracking circuitry of FIG. 6 in read and/or write operations, in accordance with an embodiment.

As discussed above, during read and/or write operations, it may be advantageous to take into account the cycle count 134 associated of the memory cells 102 being operated on due to the voltage downshift 150 and/or voltage upshift 152. To help illustrate the application of the cycle tracking circuitry 170, FIG. 8 is a schematic diagram of a portion 210 of the memory device 100 performing a read and/or write operation. A read/write request 212 to store or access data may be initiated by a computing system coupled to the memory device 100 or internally generated by the memory device 100, for example, as part of a refresh operation. The requested memory address 214 of the read/write request 212 may be interpreted via memory address lookup circuitry 216 to determine to which memory block 160 the requested memory address 214 belongs. In some embodiments, the memory address lookup circuitry 216 may compare the requested memory address 214 with the memory addresses 162 (e.g., start address 180 and/or end address 182) of the shadow registers 176 and reference the corresponding cycle count register 172 to obtain the cycle count value 218 of the memory cell 102 at the requested memory address 214. For example, if the requested memory address 214 falls between the start address 180 and the end address 182 of the shadow register 176 defining Memory Block 1 160-1, Cycle Count Register 1 172-1 may be referenced for its stored cycle count value 218.

In some embodiments, the cycle count value 218 obtained from the cycle count register 172 corresponding to the read/write request 212 may be interpreted by shift index circuitry 220 to determine the extent of the operating adjustments to be made during the read/write operations. The shift index circuitry 220 may reference one or more windows 222 and compare the cycle count value 218 to the windows 222. The windows 222 may correspond to cycle count brackets and relate the cycle count values 218 to a set number of discrete shift indices 224. For example, if the cycle count value 218 is representative of a relatively small cycle count (e.g., less than 100, less than 1,000, etc.) the cycle count value 218 may fall into a small count window 222-0. The shift index circuitry 220 may output a shift index 224 corresponding to the small count window 222-0 utilized by read/write circuitry 226 to set the sense voltage (e.g., sense voltage SV1, sense voltage SV2, or other sense voltages) at an appropriate level for memory cells 102 with a relatively small cycle count. For example, returning momentarily to FIG. 4, as the voltage downshift 150 may be relatively minor for memory cells 102 with a relatively small cycle count, a base sense voltage (e.g., sense voltage SV1) may be utilized for cycle count values 218 falling into the small count window 222-0. Moreover, if the cycle count value 218 is representative of a relatively high cycle count (e.g., greater than a threshold), the cycle count value 218 may fall into an high cycle window 222-2, and a shift index 224 corresponding to the high cycle window 222-2 may be utilized by read/write circuitry 226 to set the threshold voltage at an appropriate level for memory cells 102 with a relatively high cycle count. For example, as the voltage downshift 150 for memory cells 102 having a relatively high cycle count 134 (e.g., greater than 1,000, greater than 10,000, greater than 100,000, etc.) may be more significant than those having a relatively small cycle count, the sense voltage may be shifted (e.g., to sense voltage SV2 from sense voltage SV1).

Furthermore, any number of intermediate windows (e.g., window 222-1) with corresponding shift indices 224 and intermediate sense voltages (e.g., between sense voltages SV1 and SV2) may be utilized depending on the desired granularity and implementation. Keeping with the example of FIG. 3, if the cycle count value 218 is representative of a relatively very high cycle count (e.g., corresponding to the voltage upshift 152) the cycle count value 218 may fall into to a very high count window 222-3. For example, as the voltage upshift 152 for memory cells 102 having a relatively very high cycle count 134 may cancel, at least partially, the voltage downshift 150, the sense voltage may be shifted (e.g., to sense voltage SV1 or other intermediate sense voltage from sense voltage SV2). As should be appreciated, the cycle values 218 discussed herein are given as examples and may depend on implementation (e.g., material properties, temperature, operating voltages, etc.) and/or desired granularity. Furthermore, as discussed above, the order of voltage downshifts 150 and/or voltage upshifts 152 as the cycle count 134 increases may depend on implementation. As such, the windows 222 (e.g., small count window 222-0, intermediate window 222-1, high count window 222-2, and/or very high count window 222-3) may be associated with sense voltage downshifts 156 or sense voltage upshifts 158. Moreover, in some embodiments, the windows 222 may correspond to relative sense voltage shifts (e.g., sense voltage downshifts 156 or sense voltage upshifts 158) relative to a reference sense voltage.

As discussed above, tracking of the voltage downshift 150 and voltage upshift 152 may be used to adjust the sense voltages as well as pre-read voltages and selection/programming voltages and/or currents. As such, the read/write circuitry 226 may use the shift index 224 as input for any operation where the cycle count 134 of the memory cell 102 may be a factor. Additionally or alternatively, the cycle count value 218 may be directly referenced to determine a sense voltage (e.g., sense voltage SV1, sense voltage SV2, or other sense voltage), pre-read voltage, program current (e.g., during writes), and/or memory cell 102 selection voltage. For example, the cycle count value 218 may be used as a shift index 224 without categorization into a window 222 either directly, with a granularity corresponding to the increment 178, or indirectly, for example based on a formulaic algorithm.

With these technical effects in mind, multiple memory devices may be included on a memory module, thereby enabling the memory devices to be communicatively coupled to the processing circuitry as a unit. For example, a dual in-line memory module (DIMM) may include a printed circuit board (PCB) and multiple memory devices. Memory modules respond to commands from a memory controller communicatively coupled to a client device or a host device via a communication network. Or in some cases, a memory controller may be used on the host-side of a memory-host interface; for example, a processor, microcontroller, field programmable gate array (FPGA), application-specific integrated circuit (ASIC), or the like may each include a memory controller. This communication network may enable data communication there between and, thus, the client device to utilize hardware resources accessible through the memory controller. Based at least in part on user input to the client device, processing circuitry of the memory controller may perform one or more operations to facilitate the retrieval or transmission of data between the client device and the memory devices. Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory controller operations and memory writing operations may manifest as improvements in visualization quality (e.g., speed of rendering, quality of rendering), improvements in processing operations, improvements in calculations, or the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
   a memory array comprising a plurality of memory cells;
   a first cycle count register configured to track a first cycle count value representative of a first number of past accesses of a first set of the plurality of memory cells; and
   cycle tracking circuitry configured to increase the first cycle count value of the first cycle count register in response to a first access of a first memory cell of the first set of the plurality of memory cells.

2. The memory device of claim 1, comprising a second cycle count register configured to track a second cycle count value representative of a second number of past accesses of a second set of the plurality of memory cells, and wherein the cycle tracking circuitry is configured to increase the second cycle count value of the second cycle count register in response to a second access of a second memory cell of the second set of the plurality of memory cells.

3. The memory device of claim 1, wherein the plurality of memory cells are associated with a respective plurality of memory addresses, and wherein the first set of the plurality of memory cells comprises memory cells with respective memory addresses associated with the first cycle count register.

4. The memory device of claim 3, comprising one or more shadow registers associated with the first cycle count register and configured to store a start address of the respective memory addresses and an end address of the respective memory addresses.

5. The memory device of claim 1, comprising control circuitry configured to determine a voltage parameter of the first access based at least in part on the first cycle count value.

6. The memory device of claim 5, wherein the voltage parameter comprises a sense voltage associated with reading of the first memory cell.

7. The memory device of claim 1, wherein the first access comprises a read of the first memory cell or a write to the first memory cell.

8. The memory device of claim 7, wherein the cycle tracking circuitry is configured to:
   in response to the first access comprising the read of the first memory cell, increase the first cycle count value by a first amount; and
   in response to the first access comprising the write to the first memory cell, increase the first cycle count value by a second amount, wherein the second amount is greater than the first amount.

9. A method comprising:
   assigning, via cycle tracking circuitry, a first memory block with a first plurality of memory addresses corresponding to a first plurality of memory cells of a memory device, wherein the first memory block is associated with a first cycle count register configured to track a first cycle count value representative of a first number of past accesses of the first plurality of memory cells; and
   assigning, via the cycle tracking circuitry, a second memory block with a second plurality of memory addresses corresponding to a second plurality of memory cells of the memory device, wherein the second memory block is associated with a second cycle count register configured to track a second cycle count value representative of a second number of past accesses of the second plurality of memory cells; and
   in response to a request to access a memory cell of the first plurality of memory cells, retrieving the first cycle count value from first cycle count register.

10. The method of claim 9, comprising determining a voltage parameter associated with accessing the memory cell based at least in part on the first cycle count value.

11. The method of claim 9, wherein the request to access the memory cell comprises a write request, the method comprising, in response to the write request, reassigning at least a portion of the second plurality of memory cells to the first memory block.

12. The method of claim 11, wherein the portion of the second plurality of memory cells is reassigned to the first memory block in response to the write request requesting to write to at least a first portion of the first plurality of memory cells and at least a second portion of the second plurality of memory cells.

13. The method of claim 11, comprising, in response to reassigning the portion of the second plurality of memory cells to the first memory block, updating the first cycle count value based at least in part on the second cycle count value.

14. The method of claim 13, wherein updating the first cycle count value comprises determining a weighted average of the first cycle count value and the second cycle count value.

15. The method of claim 9, comprising:
   in response to the request to access the memory cell, accessing the memory cell; and
   updating the first cycle count value based on the accessing of the memory cell.

16. The method of claim 9, wherein the request to access the memory cell comprises a write request, the method comprising, in response to the write request, reassigning at least a portion of the first plurality of memory cells to a third memory block and updating a third cycle count register associated with the third memory block based at least in part on the first cycle count value.

17. A computing system comprising:
   a memory device comprising a plurality of memory cells;
   one or more processors commutatively coupled to the memory device and configured to request one or more accesses of the plurality of memory cells; and
   cycle tracking circuitry configured to maintain cycle count values representative of a history of the one or more accesses to the plurality of memory cells.

18. The computing system of claim 17, wherein the cycle tracking circuitry is disposed, at least partially, on-die with the plurality of memory cells.

19. The computing system of claim 17, comprising control circuitry configured to regulate electrical characteristics of an access to the plurality of memory cells based at least in part on the cycle count values.

20. The computing system of claim 19, wherein the access comprises a read of a memory cell of the plurality of memory cells, and wherein the electrical characteristics comprise a sense voltage associated with the read.

* * * * *